United States Patent
Takeuchi et al.

(12) United States Patent (10) Patent No.: US 6,262,439 B1
(45) Date of Patent: Jul. 17, 2001

(54) SILICON CARBIDE SEMICONDUCTOR DEVICE

(75) Inventors: Yuichi Takeuchi, Obu; Tsuyoshi Yamamoto, Kariya, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/200,701

(22) Filed: Nov. 27, 1998

(30) Foreign Application Priority Data

Nov. 28, 1997 (JP) .................................................. 9-328991

(51) Int. Cl.[7] .................... H01L 29/78; H01L 31/0312
(52) U.S. Cl. ...................... 257/77; 257/331; 257/339; 257/341; 257/356
(58) Field of Search ................................ 257/77, 341, 339, 257/356, 331

(56) References Cited

U.S. PATENT DOCUMENTS

| | | |
|---|---|---|
| 5,170,231 | 12/1992 | Fujii et al. . |
| 5,233,215 | 8/1993 | Baliga . |
| 5,323,040 | 6/1994 | Baliga . |
| 5,399,515 | 3/1995 | Davis et al. . |
| 5,506,421 | 4/1996 | Palmour . |
| 5,614,749 | 3/1997 | Ueno . |
| 5,623,152 * | 4/1997 | Majumdar ............................ 257/331 |
| 5,661,312 | 8/1997 | Weitzel et al. . |
| 5,693,569 | 12/1997 | Ueno . |
| 5,723,376 | 3/1998 | Taekuchi et al. . |
| 5,744,826 | 4/1998 | Takeuchi et al. . |
| 5,747,831 | 5/1998 | Loose et al. . |
| 5,831,288 * | 11/1998 | Singh ..................................... 257/27 |

FOREIGN PATENT DOCUMENTS

| | | |
|---|---|---|
| 656 661 A1 | 6/1995 | (EP) . |
| 676 8124 A2 | 10/1995 | (EP) . |
| 4-239778 | 8/1992 | (JP) . |
| 5-102497 | 4/1993 | (JP) . |
| 7-131016 | 5/1995 | (JP) . |
| 8-288500 | 11/1996 | (JP) . |
| 9-074193 | 3/1997 | (JP) . |

OTHER PUBLICATIONS

Palmour, et al., "6–H–Silicon Carbide Power Devices for Aerospace Applications", Proceedings of the 28th Intersociety Energy Conversion Engineering Conference, IECEC–93, Aug. 8–13, 1993, vol. 1, pp. 1.249–1254.

"Power Mosfets Formed in Silicon Carbide", Electronic Components and Circuits, NASA Tech Briefs Energy 1995.

* cited by examiner

Primary Examiner—Jerome Jackson, Jr.

(57) ABSTRACT

A semiconductor substrate includes a first conductivity type semiconductor layer and a second conductivity type semiconductor layer thereon. A first conductivity type semiconductor region is formed in a surface portion of the second conductivity type semiconductor layer and is divided into first and second regions. A trench is formed in the semiconductor substrate so as to penetrate the second conductivity type semiconductor layer and to reach the first conductivity type semiconductor layer. The first region is disposed around the trench so that the side surface of the first region is exposed to the trench. The second region is disposed to be distant from the trench and to be adjacent to the first region. A bottom face of the second region is located to a position deeper than that of said first region. As a result, when a high voltage is applied between a source and a drain, it is possible to cause a punch-through phenomenon to occur at the second region earlier than at the first region.

27 Claims, 9 Drawing Sheets

SILICON CARBIDE SEMICONDUCTOR DEVICE

CROSS REFERENCE TO RELATED APPLICATION

This application is based upon and claims priority from Japanese Patent Application No. H. 9-328991 filed Nov. 28, 1997, the contents of which are incorporated herein by reference.

BACKGROUND OF THE INVENTION

1. Field of the Invention

This invention relates to a silicon carbide semiconductor device and in particular relates to a vertical type insulated gate field effect transistor for large electric power use (hereinafter, referred to as "vertical type power MOSFET).

2. Related Art and Discussion

Figure 16:
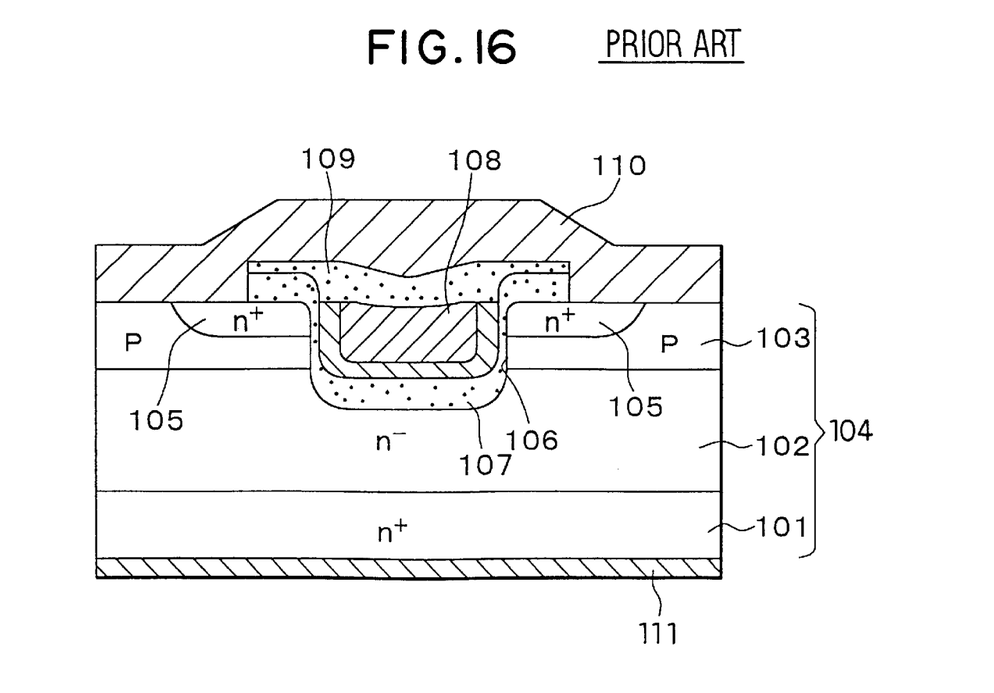
FIG. 16 is a sectional view illustrating a conventional vertical type power MOSFET.

FIG. 16 shows a sectional constitution of a vertical type power MOSFET described in JP-A-7-326755. The conventional vertical type power MOSFET is explained with reference to FIG. 16.

In FIG. 16, an SiC substrate 104 is formed by successively depositing an n$^-$-type epitaxial layer 102 and a p-type epitaxial layer 103 on an n$^+$-type monocrystalline SiC semiconductor substrate 101.

An n$^+$ source region 105 constituting a semiconductor region is formed in the p-type epitaxial layer 103 by ion implantation or the like. Also, a trench 106 passing through the n$^+$ source region 105 and the p-type epitaxial layer 103 and reaching the n$^-$-type epitaxial layer 102 is formed by etching. Inside the trench 106, a gate thermal oxide film (insulation film) 107 is formed, and a gate electrode layer 108 is formed thereon. Also, a source electrode layer 110 constituting a first electrode layer is formed on an interlayer insulation film 109, the surface of the n$^+$-type source region 105 and the surface of the p-type epitaxial layer 103. A drain electrode layer 111 constituting a second electrode layer is formed on the back surface of the semiconductor substrate 104.

In the construction described above, the surface of the p-type epitaxial layer 103 on the side surface of the trench 106 is a channel region. When a positive voltage is impressed on the gate electrode 108 and a channel is formed in the side surface of the p-type epitaxial layer 103, current flows between the source and the drain.

However, when a high voltage is impressed between the source and the drain while the vertical type power MOSFET is in an off state (i.e., no voltage is applied to the gate electrode), the working life of the gate oxide film 107 is shortened because it may suffer some damage or a blocking voltage thereof becomes small comparing to a design value.

To solve the above-mentioned problems, the inventors built a prototype of the conventional vertical type power MOSFET and studied it.

When a voltage is applied between the source and the drain during the off state of the vertical type power MOSFET, a depletion layer is produced at a PN junction portion between n$^-$-type epitaxial layer 102 and the p-type epitaxial layer 103, whereby an electric field is generated. The distribution of the electric field depends on impurity concentrations of the n$^-$-type epitaxial layer 102 and the p-type epitaxial layer 103 and the magnitude of voltage applied between the source and the drain. The blocking voltage of the power MOSFET is determined by the condition at which a punch-through phenomenon occurs, that is, the depletion layer extending on a side of the p-type epitaxial layer 103 reaches the n$^+$-type source region 105.

Figure 17:
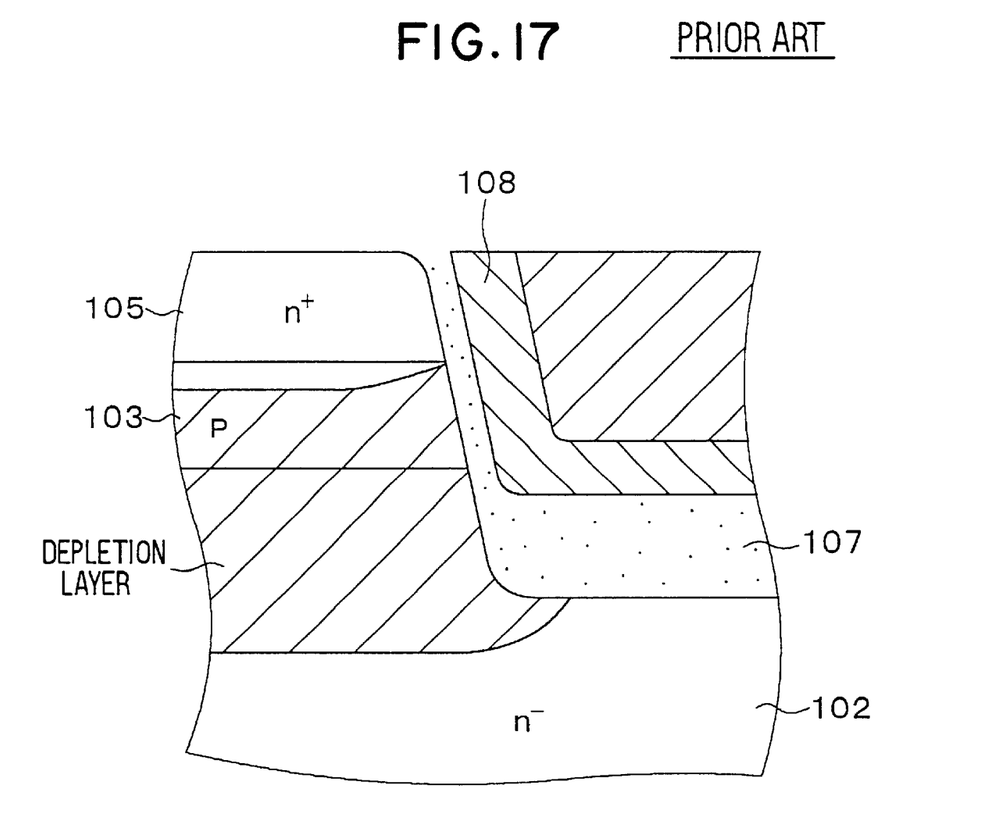
FIG. 17 is a schematic view for explaining a depletion layer produced in the power MOSFET shown in FIG. 16.

It was confirmed that a measured blocking voltage lowers rather than a design blocking voltage in the prototype of the conventional power MOSFET. As the cause thereof, it is considered that the side surface of the trench 106 is formed not to be perpendicular to the surface of the SiC substrate 104 but to be inclined to some extent with respect thereto. FIG. 17 shows a schematic view of the vertical type power MOSFET in which a high voltage is impressed between the source and the drain during the off state thereof. The reason why the measured blocking voltage lowers is described with reference to FIG. 17.

The depletion layer is produced at the PN junction portion between the n$^-$-type epitaxial layer 102 and the p-type epitaxial layer 103. The end portion of the depletion layer which makes contact to the surface of the trench 106 (hereinafter, referred to as "depletion layer end portion") is terminated in a state that it is substantially perpendicular to the surface of the trench 106. For this reason, if the side surface of the trench 106 is perpendicular to the surface of the SiC substrate 104, the depletion layer end portion will be terminated in a state that it is substantially parallel to the surface of the SiC substrate 104. However, when the trench 106 is formed by etching, in practice, the side surface of the trench 106 is formed to be inclined to some extent with respect to the surface of the SiC substrate 104. Therefore, as shown in FIG. 17, the depletion layer end portion is terminated in a state that it is curved in the vicinity of the trench 106.

As a result, the depletion layer end portion reaches the boundary between the p-type epitaxial layer 103 and the n$^+$-type source region 105 earlier than the other portion of the depletion layer. For this reason, it is considered that a punch-through phenomenon occurs at an SiO$_2$/SiC interface which is an interface with the gate thermal oxide film 107 comprising an SiO$_2$ film earlier than the other portion, whereby the actual blocking voltage lowers rather than the design value.

To confirm this consideration, a source-drain voltage causing the punch-through phenomenon was measured while a gate voltage is changed. As a result, it was confirmed that the source-drain voltage causing the punch-through phenomenon has strong dependence upon the gate voltage. This result means that the punch-through phenomenon mainly occurs at the SiO$_2$/SiC interface and is in agreement with the above-mentioned consideration.

In view of the above, the inventors concluded that the cause of the gate oxide film damage and the shortened working life of the gate oxide film is in that current generated by the punch-through phenomenon is greatly accelerated along the SiO$_2$/SiC interface and functions as a hot carrier, thereby deteriorating the SiO$_2$/SiC interface and the gate oxide film.

SUMMARY OF THE INVENTION

It is therefore an object of the invention to provide a silicon carbide semiconductor device which can prevent the working life of the gate oxide film from being shortened.

To achieve this object, in the silicon carbide semiconductor device according to the present invention, a semiconductor substrate made of single crystal silicon carbide is formed by successively depositing a first conductivity type second semiconductor layer and a second conductivity type third semiconductor layer on a first conductivity type first semiconductor layer. A first conductivity type semiconductor region is formed in a surface portion of the third semiconductor layer and is divided into first and second regions. A trench is formed in the semiconductor substrate so as to penetrate the third semiconductor layer and reach the second semiconductor layer. The first region is disposed around the trench so that the side surface of the first region is exposed to the trench. The second region is disposed to be distant from the trench and to be adjacent to the first region. The thickness of the third semiconductor layer between the second region and the second semiconductor layer is made thinner than that of the third semiconductor layer between the first region and the second semiconductor layer.

When the thickness of the third semiconductor layer is set as described above, the punch-through phenomenon occurs on a second region side. As a result, it is possible to prevent the punch-through phenomenon from occurring at an interface between a gate insulation film formed in the trench and the third semiconductor layer, i.e., at an $SiO_2$/SiC interface. Therefore, it is possible to prevent the working life of the gate insulation film from being shortened.

Alternatively, the second region can be formed by metal silicide or metal carbide.

Further, a stepped portion may be formed on the surface of the third semiconductor layer so that the surface of the third semiconductor layer in the region for the first region to be formed is made higher than that in the region for the second region to be formed. After that, by performing, for example, ion implantation toward the surface of the third semiconductor layer, the bottom face of the second region can be located deeper than that of the first region.

Furthermore, a groove may be formed in the surface of the third semiconductor layer so that the bottom face of the groove is located to a position deeper than the bottom face of the first region. From the bottom face of the groove, metal is thermally diffused in the third semiconductor layer to form metal silicide and metal carbide therein, or on the bottom face of the groove, a source electrode itself is deposited. Due to this arrangement, since the depletion layer extending on a third semiconductor layer side reaches the second region earlier than the first region, the punch-through phenomenon occurs on the second region side.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PREFERRED EMBODIMENTS (First Embodiment)

Figure 1:
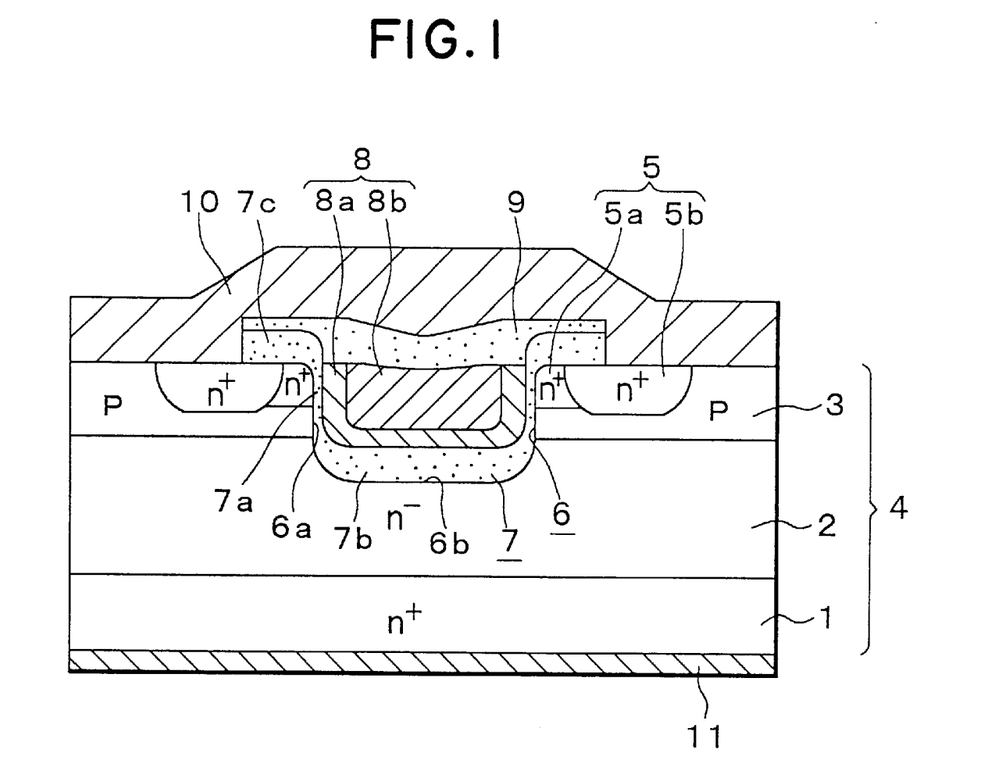
FIG. 1 is a sectional view illustrating a vertical type power MOSFET according to a first preferred embodiment of the present invention.

A vertical type n-channel power MOSFET according to a first preferred embodiment of the present invention will be described with reference to FIG. 1.

An $n^+$-type silicon carbide (SiC) semiconductor substrate 1 serving as a low resistance semiconductor layer is made of hexagonal crystal system silicon carbide. An $n^-$-type SiC semiconductor layer 2 serving as a high resistance semiconductor layer and a p-type SiC semiconductor layer 3 are successively layered on a main surface of the $n^+$-type SiC semiconductor substrate 1. As described above, a semiconductor substrate 4 made of single crystal silicon carbide is formed by the $n^+$-type SiC semiconductor substrate 1, the $n^-$-type SiC semiconductor layer 2 and the p-type SiC semiconductor layer 3.

A source region 5 made of an $n^+$ semiconductor region is formed in a predetermined region at a surface portion of the p-type SiC semiconductor layer 3. The source region 5 comprises a region (first semiconductor region) 5a adjacent to a side surface 6a of a trench 6 and a region (second semiconductor region) 5b distant from the trench side surface 6a. The junction depth of the region 5b to the p-type SiC semiconductor layer 3 is made deeper than that of the region 5a, that is, the bottom face of the region 5b is located to a position lower than that of the region 5a. As a result, the thickness of the p-type SiC semiconductor layer 3 between the region 5b and the $n^-$-type SiC semiconductor layer 2 is made thinner than the thickness of the p-type SiC semiconductor layer 3 between the region 5a and the $n^-$-type SiC semiconductor layer 2.

The trench 6 passing through the source region 5 and the p-type SiC semiconductor layer 3 and reaching the $n^-$-type SiC semiconductor layer 2 is formed in a predetermined region of the source region 5. This trench 6 has the side surface 6a substantially perpendicular to the surface of the semiconductor substrate 4 and a bottom surface 6b parallel with the surface of the semiconductor substrate 4.

A gate insulation film 7 is formed on the side surface 6a and bottom surface 6b of the trench 6. A gate electrode layer 8 is filled inside the gate insulation film 7. Further, an interlayer insulation layer 9 is formed to cover the gate insulation film 7 and the gate electrode layer 8.

A source electrode (first electrode layer) 10 is then formed by aluminum or the like on the source region 5, the low resistance p-type SiC semiconductor layer 3 and the interlayer insulation layer 9. A drain electrode (second electrode layer) 11 is formed on the back surface of the $n^+$-type SiC semiconductor substrate 1 (back surface of the semiconductor substrate 4).

In the vertical type power MOSFET structured as described above, the junction depth of the region 5a adjacent to the trench side surface 6a is made shallower than that of the region 5b distant from the trench side surface 6a (the region 5b making contact with the source electrode 10). For this reason, when a high voltage is impressed between the source and the drain, the depletion layer extending on a p-type SiC semiconductor layer 3 side reaches the region 5b earlier than the region 5a adjacent to the trench side surface 6a. As a result, a punch-through phenomenon occurs in the region 5b with the voltage lower than the voltage with which the punch-through phenomenon occurs at the $SiO_2$/SiC interface (channel portion) present on the trench side surface 6a. Thereby, it is possible to prevent current generated by the punch-through phenomenon from flowing through the $SiO_2$/SiC interface.

Consequently, not only deterioration of the $SiO_2$/SiC interface and the gate oxide film 7 can be prevented, but also device breakdown due to current concentration can be prevented since the punch-through phenomenon occurs at the entire bottom face of the region 5b.

Next, the manufacturing process of the vertical type n-channel power MOSFET will be described with reference to FIGS. 2 through 8.

Figure 2:
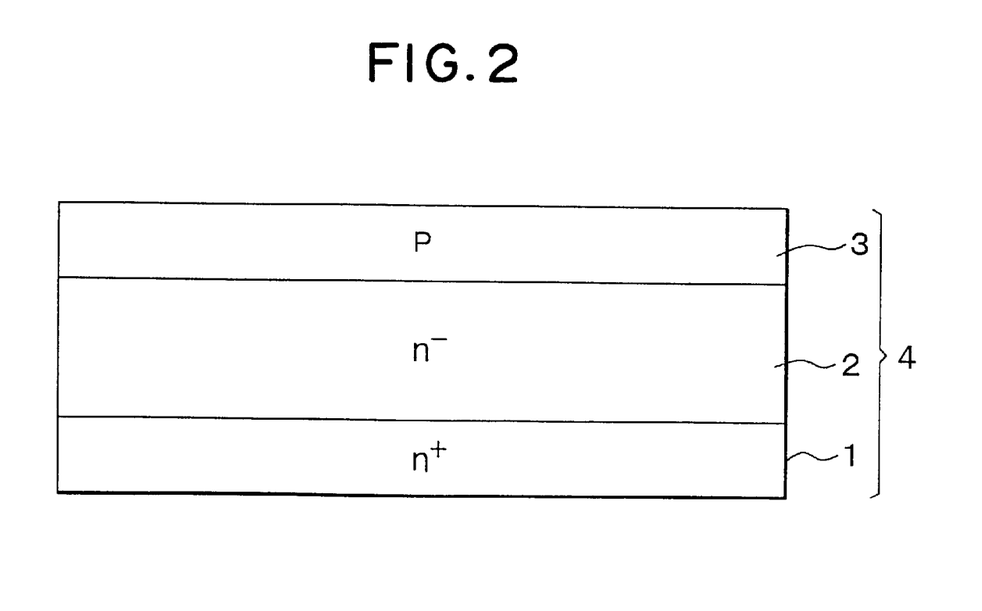
FIGS. 2 through 8 are views illustrating a manufacturing process of the power MOSFET shown in FIG. 1 in a stepwise manner.

First, as shown in FIG. 2, the $n^+$-type SiC semiconductor substrate 1 serving as the low resistance semiconductor layer is prepared. The $n^-$-type SiC semiconductor layer 2 is epitaxially grown on the main surface of the $n^+$-type SiC semiconductor substrate 1. Further, the p-type SiC semiconductor layer 3 is epitaxially grown on the $n^-$-type SiC semiconductor layer 2. In this way, the semiconductor substrate 4 is formed from the $n^+$-type SiC semiconductor substrate 1, the $n^-$-type SiC semiconductor layer 2 and the p-type SiC semiconductor layer 3.

After that, a power MOSFET as a semiconductor element is formed on the semiconductor substrate 4.

Figure 3:
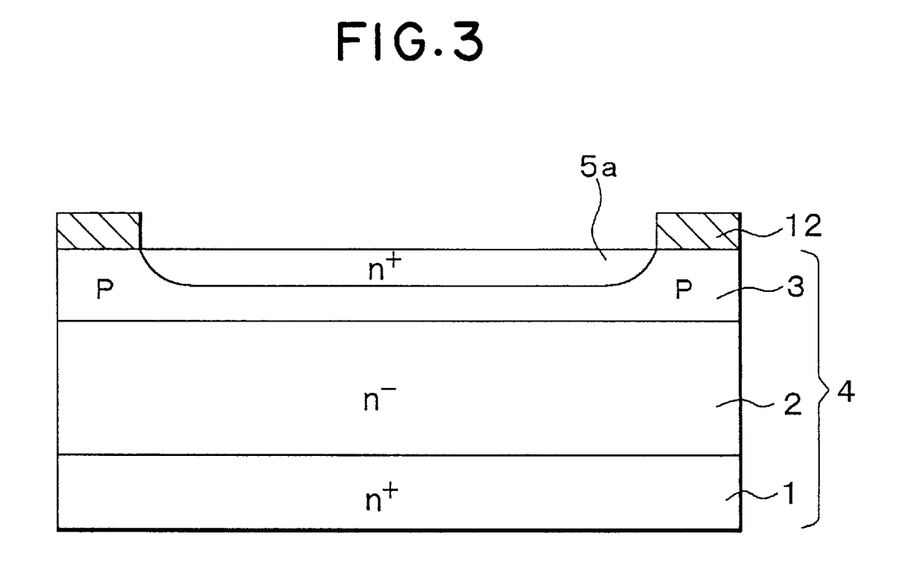
Figure 4:
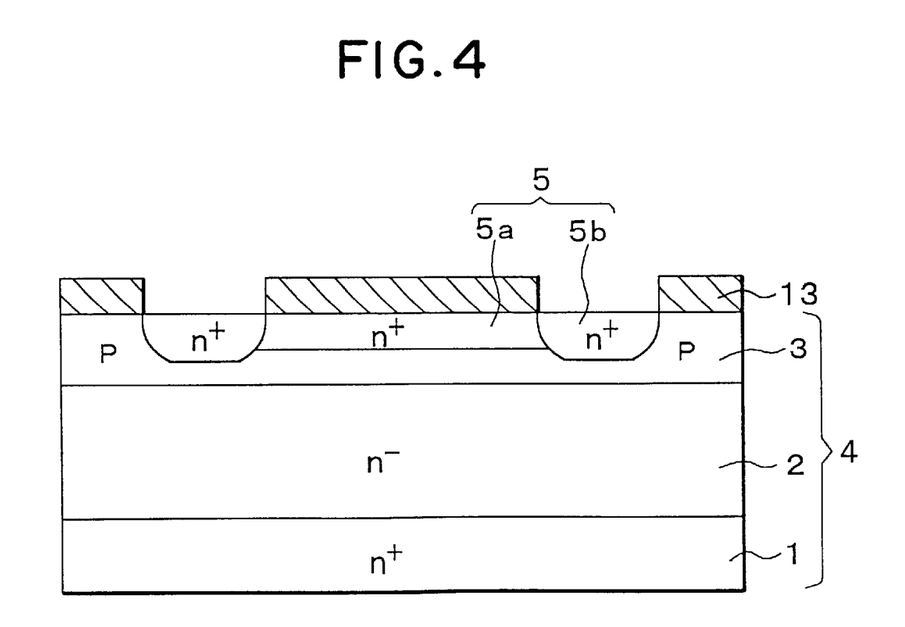

First, as shown in FIG. 3, the region 5a is formed by implanting, for example, nitrogen ions into the p-type epitaxial layer 3 using a first mask 12. After that, as shown in FIG. 4, the region 5b is formed by implanting, for example, nitrogen ions into the p-type epitaxial layer 3 using a second mask 13. Acceleration voltages of ion implantations for forming the regions 5a and 5b are adjusted so that the junction depth of the region 5b is deeper than that of the region 5a. In this way, the source region 5 made up of the regions 5a and 5b is formed.

Figure 5:
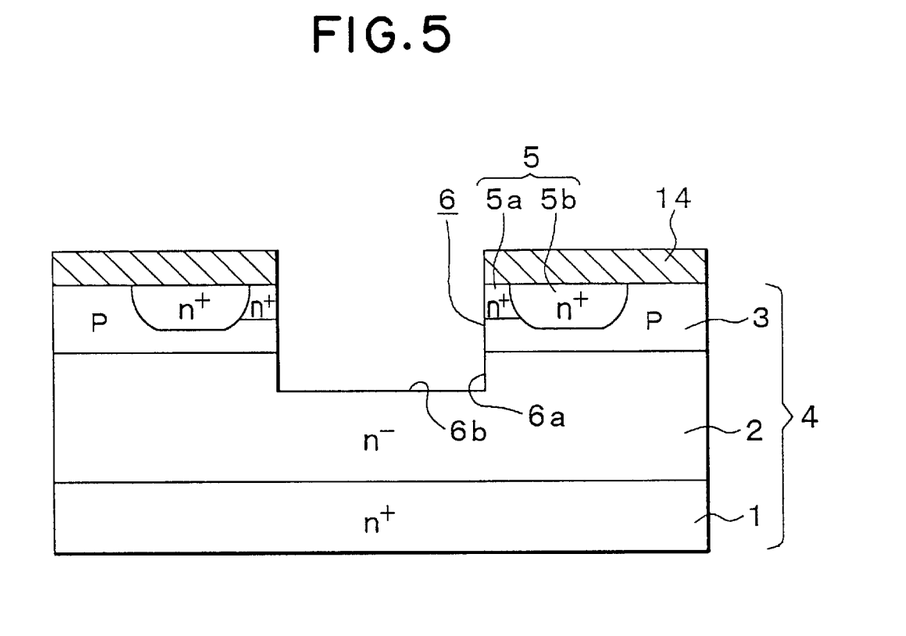

Next, as shown in FIG. 5, a trench 6 passing through the source region 5 and the p-type SiC semiconductor layer 3 and reaching the $n^-$-type SiC semiconductor layer 2 is formed by dry etching using a mask 14. This trench 6 has a side surface 6a not exactly perpendicular to but inclined to some extent with respect to the surface of the semiconductor substrate 4 and a bottom surface 6b parallel with the surface of the semiconductor substrate 4.

Figure 6:
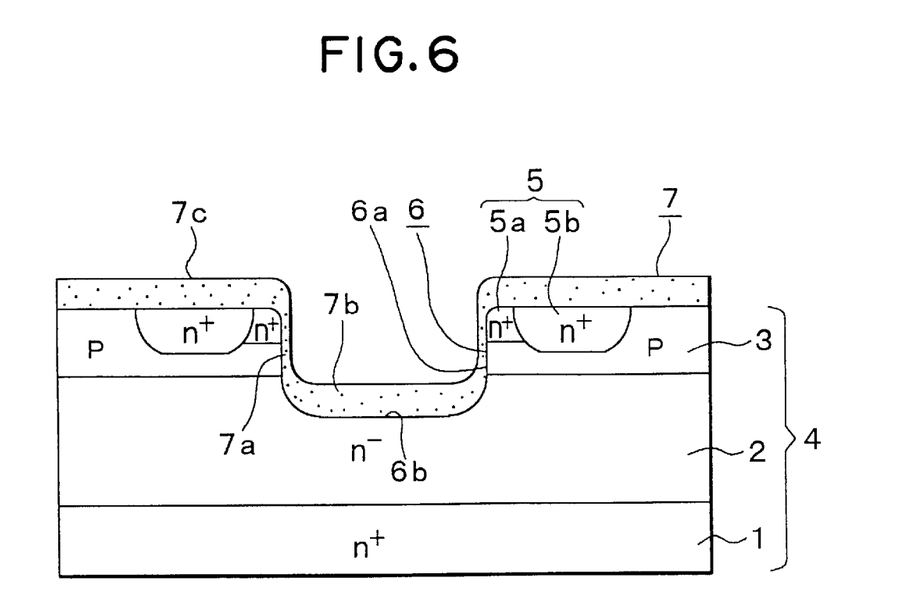

After that, as shown in FIG. 6, a gate insulation film 7 is formed by carrying out thermal oxidation. As a result of this thermal oxidation, a thermal oxide film 7a having a small thickness is formed on the side surface 6a of the trench 6, and thermal oxide films 7b, 7c having a large thickness is formed on the bottom surface 6b of the trench 6 and on the surface of the semiconductor substrate 4, respectively.

Figure 7:
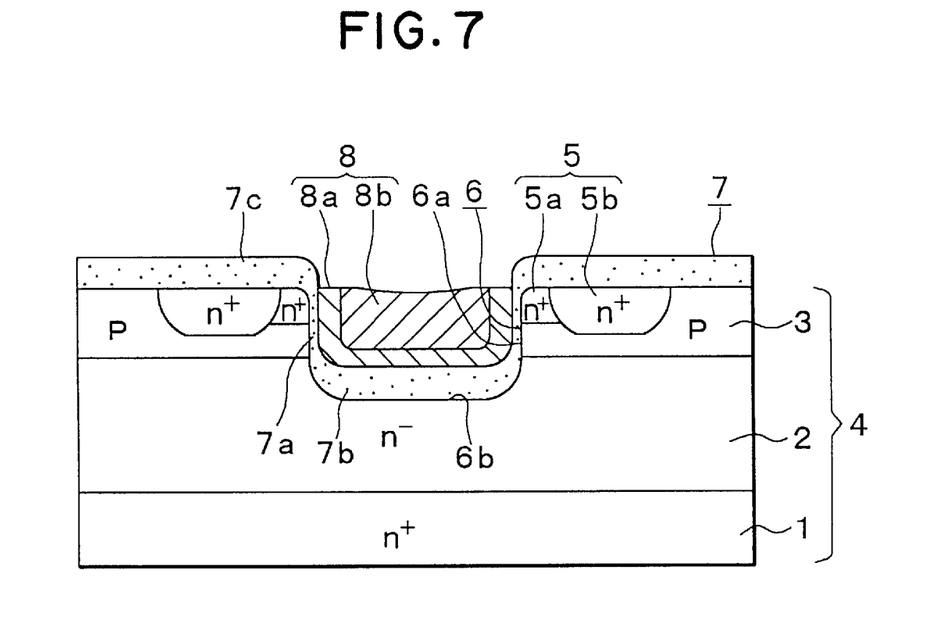
Figure 8:
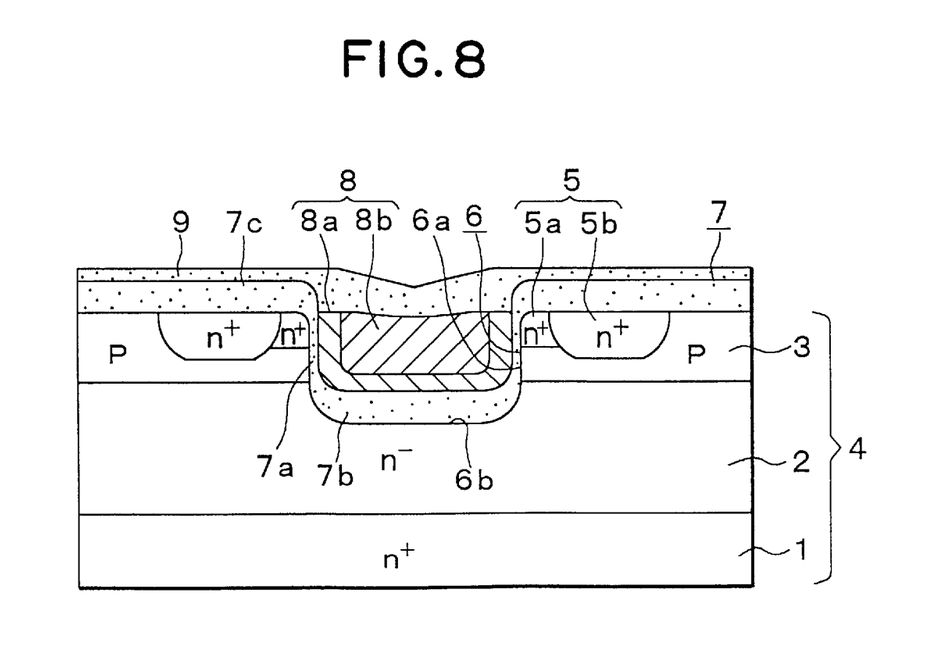

Then, as shown in FIG. 7, first and second polysilicon layers 8a, 8b are successively filled into the trench 6 to form the gate electrode 8. After that, an interlayer insulation layer 9 is formed by CVD on the gate oxide film 7 including the gate electrode 8. Then, the gate insulation film 7 and the interlayer insulation layer 9 on the source region 5 and the p-type SiC semiconductor layer 3 where a source contact is to be located are removed by etching. A source electrode layer 10 is then formed on the source region 5, the p-type SiC semiconductor layer 3 and the interlayer insulation layer 9. Finally, a drain electrode layer 11 is formed on the back surface of the $n^+$-type SiC semiconductor substrate 1, whereby the trench gate type SiC power MOSFET shown in FIG. 1 is completed.

(Second Embodiment)

In the first embodiment, the region 5a and the region 5b are formed by separate steps so that the junction depth of the region 5b is deeper than that of the region 5a. In the second embodiment, the region 5a and the region 5b are formed at the same time by the same step.

Figure 9:
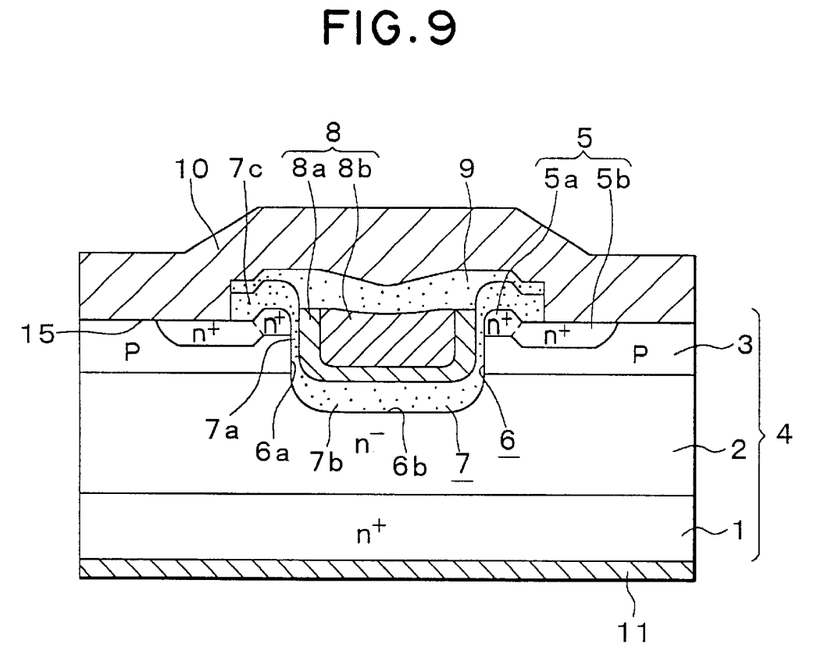
FIG. 9 is a sectional view illustrating a vertical type power MOSFET according to a second preferred embodiment.

In the second embodiment, as shown in FIG. 9, a groove 15 is formed on the surface of the p-type SiC semiconductor layer 3 by removing a predetermined region of the p-type SiC semiconductor layer 3 by a dry etching process before the regions 5a and 5b constituting the source region 5 are formed. After that, by implanting ions into the p-type SiC semiconductor layer 3, the regions 5a and 5b can be formed at the same time.

In this case, because a stepped portion is formed on the surface of the p-type SiC semiconductor layer 3 by the groove 15, when the thickness of the source region formed by ion implantation is constant, the region 5b is formed under the surface of the region (lower step portion) which has been subject to dry etching, and the region 5b is formed under the surface of the region (upper step portion) which has not been subject to dry etching. As a result, the region 5b formed in the lower step portion has a bottom face at a deeper position than the region 5a formed in the upper step portion. Therefore, the same effects as the first embodiment can be obtained by the second embodiment. In the second embodiment, the number of ion implantation steps necessary for forming the regions 5a and 5b can be reduced to one time.

(Third Embodiment)

In the first embodiment, the step for forming the region 5b is carried out following the step for forming the region 5a. In the third embodiment, the region 5b is formed after the interlayer insulation film 9 is formed.

Figure 10:
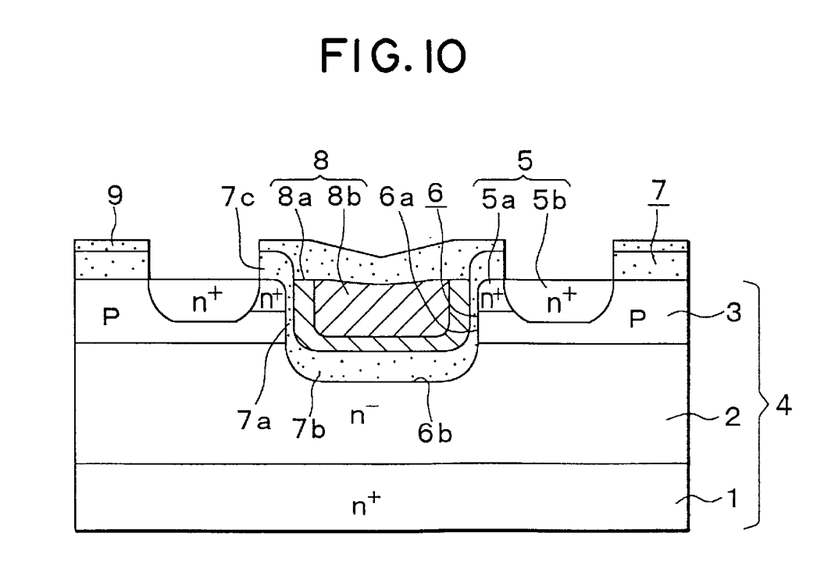
FIG. 10 is a view for explaining a manufacturing process of a vertical type power MOSFET according to a third preferred embodiment.

That is, without performing the step shown in FIG. 4, the steps shown in FIGS. 5 through 8 are successively carried out. After that, as shown in FIG. 10, after the interlayer insulation film 9 and the gate insulation film 7 in a predetermined area on the surface of the semiconductor substrate 4 are removed by etching, ion implantation is carried out using the interlayer insulation film 9 as a mask to form the region 5b of the source region 5.

Figure 11:
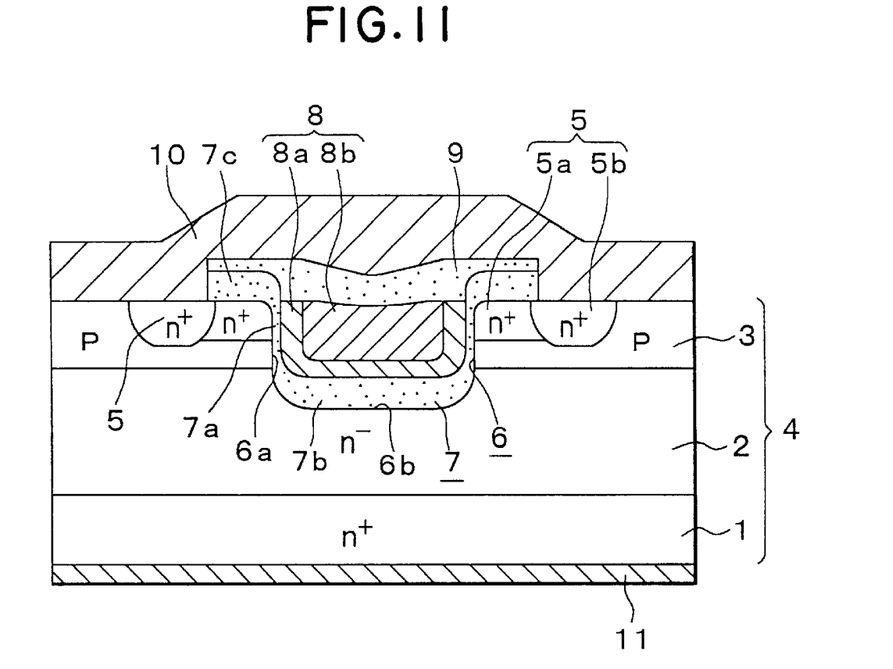
FIG. 11 is a sectional view illustrating the vertical type power MOSFET according to the third preferred embodiment.

After that, the interlayer insulation film 9 and the gate insulation film 7 in a predetermined area on the surface of the semiconductor substrate 4 are further removed by etching to allow the source electrode 10 to contact the p-type SiC semiconductor layer 3. In this state, the source electrode layer 10 is formed on the semiconductor substrate 4, to complete the vertical type SiC power MOSFET shown in FIG. 11.

According to the third embodiment, a second mask formation step necessary for ion implantation process for forming the region 5b can be eliminated.

(Fourth Embodiment)

In the first through third embodiments, the region 5b of the source region 5 is formed by implanting, for example, nitrogen ions into the p-type SiC semiconductor substrate 3 and inverting the conductivity thereof to $n^+$ type. In the fourth embodiment, a second region 20 is formed by metal silicide and metal carbide which have the same effects as the $n^+$-type semiconductor layer, and play a role of the region 5b in the first, second, or third embodiment.

Figure 12:
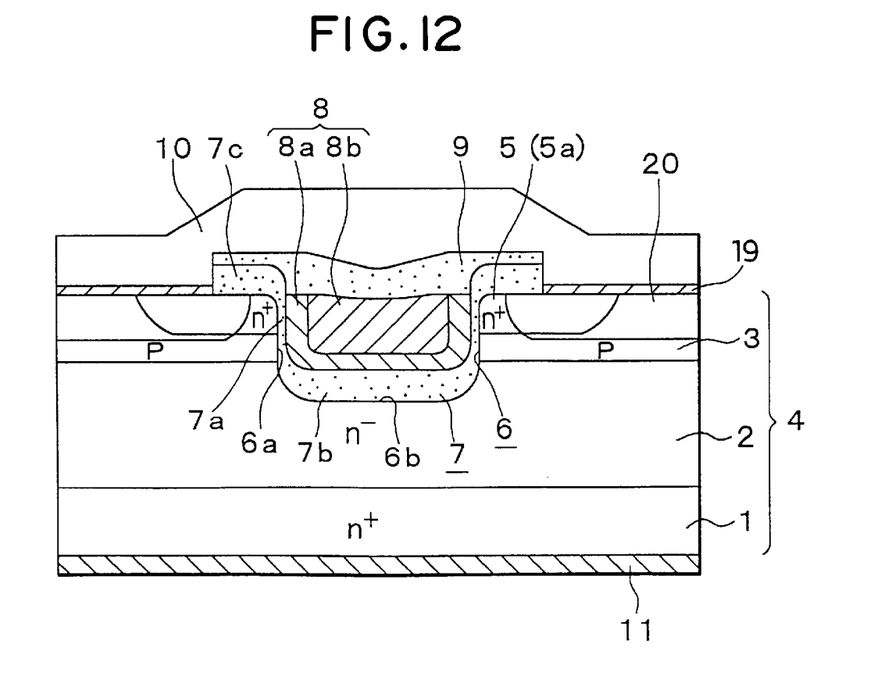
FIG. 12 is a sectional view illustrating a vertical type power MOSFET according to a fourth preferred embodiment.

That is, without performing the step shown in FIG. 4, the steps shown in FIGS. 5 through 8 are successively carried out. After that, as shown in FIG. 12, after the interlayer insulation film 9 and the gate insulation film 7 in a predetermined area on the surface of the semiconductor substrate 4 are removed by etching, a nickel (Ni) layer 19 is formed in the region where the interlayer insulation film 9 and the gate insulation film 7 are removed. A heat treatment is then carried out with respect to the semiconductor device. By this heat treatment, the second region 20 which is composed by Ni silicide and Ni carbide having the same effects as the $n^+$-type semiconductor layer is formed in the p-type SiC semiconductor layer 3 as shown in FIG. 12. At this time, heat treatment time and temperature are adjusted so that the bottom face of the second region 20 is located to a position deeper than that of the source region 5 (5a).

Further, by the second region 20 electrically connecting the source electrode 10 to the source region 5(5a), a contact resistance between the source electrode 10 made of aluminum or the like and the source region 5(5a) can be reduced. Therefore, not only the same effects as the first embodiment but also, reduced contact resistance between the source region 5 and the source electrode 10 can be obtained by the fourth embodiment.

(Fifth Embodiment)

In the fourth embodiment, the Ni layer 19 is formed on the semiconductor substrate 4, and the second region 20 composed of metal (Ni) silicide and metal carbide is formed by thermal diffusion. Further, as shown by the fifth embodiment, a groove may be formed in advance at a region where the second region 20 is to be formed.

Although, in the fourth embodiment, duration and temperature of the heat treatment are adjusted so that the bottom face of the second region 20 is located to a position is deeper than that of the source region 5, there is a possibility that the bottom face of the second region 20 is not located to a position deeper than the bottom face of the source region, or it takes long time to realize the second region 20 thermally diffused deeper than the bottom face of the source region 5 in consideration of the amount of thermally diffused metal silicide and metal carbide.

Figure 13:
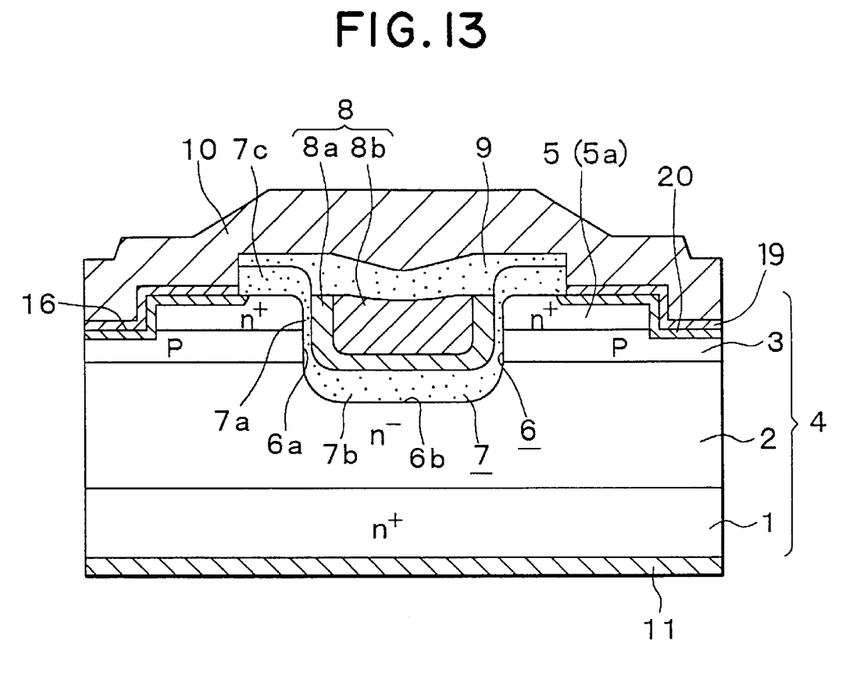
FIG. 13 is a sectional view illustrating a vertical type power MOSFET according to a fifth preferred embodiment.

For the reason described above, a groove 16 adjacent to the source region 5(5a) is formed as shown in FIG. 13. As a result, even when the amount of thermally diffused metal silicide and metal carbide is small, the bottom face of the second region 20 can be reliably reached to a position deeper than the bottom face of the source region 5 by the groove 16.

In this way, even if the amount of thermally diffused metal silicide and metal carbide is limited, the same effects as the fourth embodiment can be obtained by forming the groove 16.

It is to be noted that, because it is sufficient for the bottom face of the second region 20 to be located to a position deeper than the bottom face of the source region 5, the depth of the groove 16 may be changed depending on the amount of thermally diffused metal silicide and metal carbide. For example, the depth of the groove 16 may be shallower than the junction depth of the source region 5.

(Sixth Embodiment)

In the first through third embodiments, the source region 5 is divided into two regions 5a and 5b having different depths to which the bottom faces are located. In the sixth embodiment, the source region 5 is formed so that the bottom face thereof has a constant depth, and the bottom face of the source electrode 10 is extended to a position deeper than the bottom face of the source region 5. In this way, the extended portion of the source electrode 10 can play a role of the region 5b in the first, second, or third embodiment.

Figure 14:
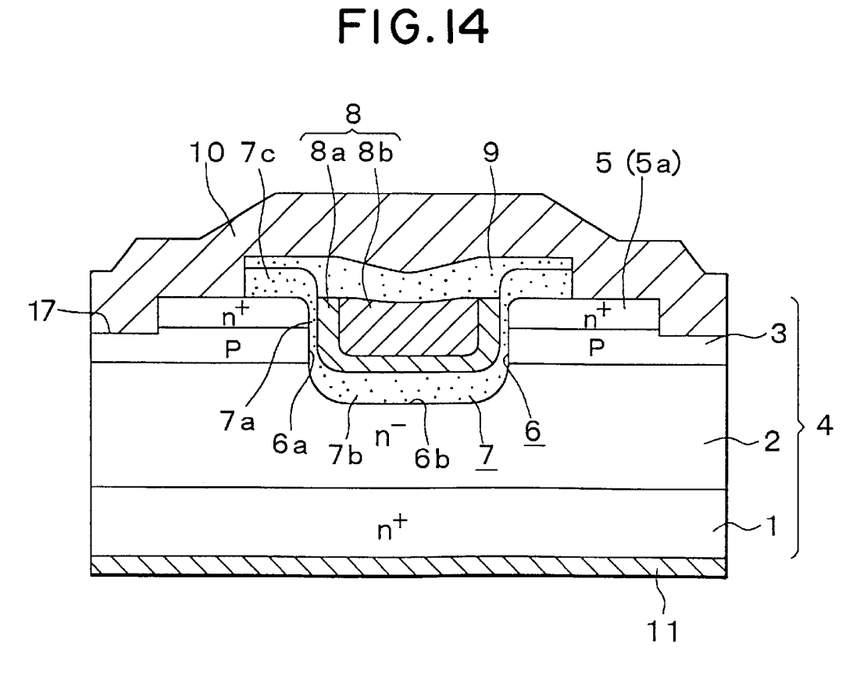
FIG. 14 is a sectional view illustrating a vertical type power MOSFET according to a sixth preferred embodiment.

FIG. 14 shows a schematic view of the vertical type power MOSFET according to the sixth embodiment. As shown in FIG. 14, a groove 17 passing through the source region 5 and reaching the p-type SiC semiconductor layer 3 is formed, and the source electrode 10 is extended to and filled in the groove 17.

In this way, when the bottom face of the source electrode 10 is located to a position deeper than the bottom face of the source region 5, the same effects as the above-described embodiments can be obtained.

In the sixth embodiment, since it is unnecessary to form the source region 5 by ion implantation as described in the first through third embodiments, the trench gate type power MOSFET can be produced by using a substrate in which a low resistance n-type SiC semiconductor layer is epitaxially grown on the p-type SiC semiconductor layer 3.

(Modifications)

The source electrode layer 10 formed on the $n^+$-type source region 5b and the p-type SiC semiconductor layer 3 can be made of a material different from that described before. Also, although the source electrode layer 10 makes contact with the p-type SiC semiconductor layer 3 to fix the potential thereof to a constant value, it may make contact at least with $n^+$-type source region 5b.

Figure 15:
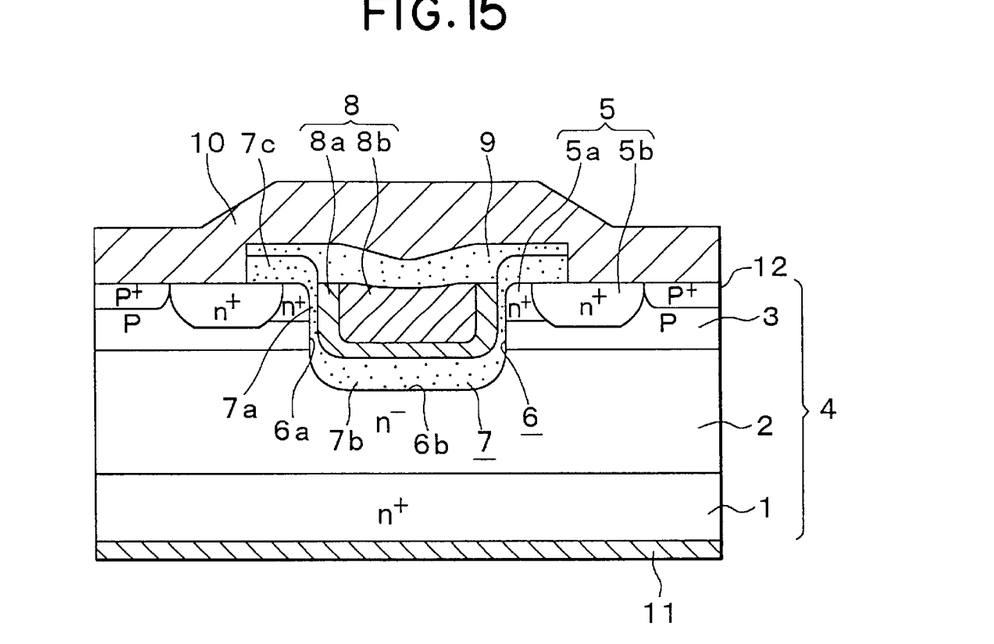
FIG. 15 is a sectional view illustrating a modification of the vertical type power MOSFET as described above.

Further, as shown in FIG. 15, a low resistance p-type SiC semiconductor layer 12 may be provided in the predetermined area of the p-type SiC semiconductor layer 3.

Furthermore, in the above-mentioned embodiments, the vertical type n-channel MOSFET is described as an example. However, the same effects as described above can be also obtained in a vertical type p-channel MOSFET.

The $n^+$-type source region 5a can be formed after the formation of the trench 6.

What is claimed is:

1. A silicon carbide semiconductor device comprising:

a semiconductor substrate made of single crystal silicon carbide, in which a first conductivity type second semiconductor layer and a second conductivity type third semiconductor layer are successively deposited on a first conductivity type first semiconductor layer, said second semiconductor layer having a resistance value higher than said first semiconductor layer;

a trench formed in said semiconductor substrate so as to penetrate said third semiconductor layer and to reach said second semiconductor layer;

a first conductivity type semiconductor region formed in a surface portion of said third semiconductor layer, wherein said semiconductor region is divided into first and second regions, said first region is disposed around said trench so that a side surface of said first region is exposed to said trench, and said second region is disposed to be distant from said trench and to be adjacent to said first region;

a gate insulation film formed on an inner wall of said trench;

a gate electrode formed on said gate insulation film in said trench;

an interlayer insulation film formed on said gate electrode to cover said gate electrode;

a first electrode layer formed on said interlayer insulation layer and electrically connected to said second region; and a second electrode layer electrically connected to said first semiconductor layer, wherein a thickness of said third semiconductor layer between said second region and said second semiconductor layer is made thinner than that of said third semiconductor layer between said first region and said second semiconductor layer.

2. The silicon carbide semiconductor device according to claim 1, wherein said second region is formed by ion implantation using said interlayer insulation film as a mask.

3. The silicon carbide semiconductor device according to claim 2, wherein said interlayer insulation film has a thickness by which ions implanted for forming said second region are blocked.

4. The silicon carbide semiconductor device according to claim 1, wherein a bottom surface of said second region is located to a position deeper than that of said first region.

5. The silicon carbide semiconductor device according to claim 4, wherein said third semiconductor layer has a stepped portion on its surface so that a surface of said third semiconductor layer in a region for said first region to be formed is made higher than that in a region for said second region to be formed.

6. A silicon carbide semiconductor device comprising:
   a semiconductor substrate made of single crystal silicon carbide, in which a first conductivity type second semiconductor layer and a second conductivity type third semiconductor layer are successively deposited on a first conductivity type first semiconductor layer, said second semiconductor layer having a resistance value higher than said first semiconductor layer;
   a first conductivity type first region made of semiconductor formed in a surface portion of said third semiconductor layer;
   a trench formed in said semiconductor substrate so as to penetrate said first region and said third semiconductor layer and to reach said second semiconductor layer;
   a second region made of metal silicide and metal carbide and formed in said third semiconductor layer so that a part of said third semiconductor layer is disposed between a bottom surface of said second region and a top surface of said second semiconductor layer in contact with said bottom surface of said second region, wherein said second region is disposed to be distant from said trench and to be adjacent to said first region;
   a gate insulation film formed on an inner wall of said trench;
   a gate electrode formed on said gate insulation film in said trench;
   an interlayer insulation film formed on said gate electrode to cover said gate electrode;
   a first electrode layer formed on said interlayer insulation layer and electrically connected to said second region; and
   a second electrode layer electrically connected to said first semiconductor layer,
   wherein a thickness of said part of said third semiconductor layer between said second region and said second semiconductor layer is made thinner than that of said third semiconductor layer between said first region and said second semiconductor layer.

7. The silicon carbide semiconductor device according to claim 6, wherein said bottom surface of said second region is located to a position deeper than that of said first region.

8. The silicon carbide semiconductor device according to claim 6, wherein said third semiconductor layer has a stepped portion on its surface so that a surface of said third semiconductor is in a particular region for said first region to be formed is made higher than that in a particular region for said second region to be formed.

9. A silicon carbide semiconductor device comprising:
   a semiconductor substrate made of single crystal silicon carbide, in which a first conductivity type second semiconductor layer and a second conductivity type third semiconductor layer are successively deposited on a first conductivity type first semiconductor layer, said second semiconductor layer having a resistance value higher than said first semiconductor layer;
   a first conductivity type semiconductor region formed in a surface portion of said third semiconductor layer;
   a trench formed in said semiconductor substrate so as to penetrate said semiconductor region and said third semiconductor layer and to reach said second semiconductor layer;
   a gate insulation film formed on an inner wall of said trench;
   a gate electrode formed on said gate insulation film in said trench;
   an interlayer insulation film formed on said gate electrode to cover said gate electrode;
   a first electrode layer formed on said interlayer insulation layer and electrically connected to said semiconductor region; and
   a second electrode layer electrically connected to said first semiconductor layer;
   wherein a groove is formed to be distant from said trench in a surface portion of said semiconductor substrate so as to penetrate said semiconductor region and to reach said third semiconductor layer;
   said groove has a bottom face contacting said third semiconductor layer; and
   said first electrode layer is disposed in said groove apart from said second semiconductor layer.

10. A trench gate type semiconductor device comprising: a semiconductor substrate in which a second conductivity type second semiconductor layer is deposited on a first conductivity type first semiconductor layer;
   a trench formed in said semiconductor substrate so as to penetrate said second semiconductor layer and to reach said first semiconductor layer;
   a first conductivity type semiconductor region formed in a surface portion of said second semiconductor layer, wherein said semiconductor region is disposed around said trench so that a side surface of said semiconductor region is exposed to said trench to define a channel portion in a side surface of said second semiconductor layer exposed to said trench;
   a gate insulation film formed on an inner wall of said trench;
   a gate electrode formed on said gate insulation film in said trench;
   a first electrode layer electrically connected to said semiconductor region;
   a second electrode layer electrically connected to said first semiconductor layer; and
   a punch-through phenomenon occurring region formed in said second semiconductor layer and electrically connected to said first electrode, wherein a thickness of said second semiconductor layer between said punch-through phenomenon occurring region and said first semiconductor layer is made thinner than that of said second semiconductor layer between said semiconductor region and said first semiconductor layer;
   wherein said punch-through phenomenon occurring region is made of first conductivity type semiconductor.

11. The trench gate type semiconductor device according to claim 10, wherein said first semiconductor layer is made up of a low resistance semiconductor layer and a high resistance semiconductor layer, and said second semiconductor layer is disposed on said high resistance semiconductor layer.

12. The trench gate type semiconductor device according to claim 10, wherein said punch-through phenomenon occurring region is made of metal silicide and metal carbide.

13. The trench gate type semiconductor device according to claim 10, wherein a groove is formed in a surface portion of said second semiconductor layer and said first electrode layer filled in said groove serves as said punch-through phenomenon occurring region.

14. The trench gate type semiconductor device according to claim 10, wherein a bottom surface of said punch-through phenomenon occurring region is located to a position deeper than that of said semiconductor region.

15. The trench gate type semiconductor device according to claim 14, wherein said second semiconductor layer has a stepped portion on its surface so that a surface of said second semiconductor layer in a region for said semiconductor region to be formed is made higher than that in a region for said punch-through phenomenon occurring region to be formed.

16. A trench gate type semiconductor device comprising:
    a semiconductor substrate in which a second conductivity type second semiconductor layer is deposited on a first conductivity type first semiconductor layer;
    a trench formed in said semiconductor substrate so as to penetrate said second semiconductor layer and to reach said first semiconductor layer;
    a first conductivity type semiconductor region formed in a surface portion of said second semiconductor layer, wherein said semiconductor region is disposed around said trench so that a side surface of said semiconductor region is exposed to said trench to define a channel portion in a side surface of said second semiconductor layer exposed to said trench;
    a gate insulation film formed on an inner wall of said trench;
    a gate electrode formed on said gate insulation film in said trench; a first electrode layer electrically connected to said semiconductor region; and a second electrode layer electrically connected to said first semiconductor layer, wherein said trench gate type semiconductor device has a bypass through which current caused by punch-through phenomenon flows between said first electrode layer and said second electrode layer while bypassing an interface of said gate insulation film and said semiconductor region serving as said channel portion;
    wherein said bypass is composed of a bypass region that is formed in a surface portion of said second semiconductor layer so that a part of said second semiconductor layer is interposed between a bottom surface of said bypass region and a top surface of said first semiconductor layer in contact with said bottom surface of said bypass region.

17. The trench gate type semiconductor device according to claim 16, wherein a depletion layer extending in a side of said second semiconductor layer does not reach an intersection of said second semiconductor layer, said semiconductor region and said gate insulation file, when voltage is impressed between said first electrode layer and said second electrode layer while no voltage is applied to said gate electrode.

18. The trench gate type semiconductor device according to claim 16, further comprising a connection region which electrically connects said first electrode layer to said semiconductor region, wherein punch-through phenomenon occurs at said connection region when voltage is impressed between said first electrode layer and said second electrode layer while no voltage is applied to said gate electrode.

19. The trench gate type semiconductor device according to claim 18, wherein a thickness of said second semiconductor layer between said semiconductor region and said first semiconductor layer is made thicker than that of said second semiconductor layer between said connection region and said first semiconductor layer.

20. A trench gate type semiconductor device comprising:
    a semiconductor substrate in which a second conductivity type second semiconductor layer is deposited on a first conductivity type first semiconductor layer;
    a trench formed in said semiconductor substrate so as to penetrate said second semiconductor layer and to reach said first semiconductor layer;
    a first conductivity type semiconductor region formed in a surface portion of said second semiconductor layer, wherein said semiconductor region is disposed around said trench so that a side surface of said semiconductor region is exposed to said trench to define a channel portion in a side surface of said second semiconductor layer exposed to said trench;
    a gate insulation film formed on an inner wall of said trench;
    a gate electrode formed on said gate insulation film in said trench;
    a first electrode layer electrically connected to said semiconductor region;
    a second electrode layer electrically connected to said first semiconductor layer; and
    a connection region which electrically connects said first electrode layer to said semiconductor region;
    wherein said trench gate type semiconductor device has a bypass through which current caused by punch-through phenomenon flows between said first electrode layer and said second electrode layer while bypassing an interface of said gate insulation film and said semiconductor region serving as said channel portion, the punch-through phenomenon occurs at said connection region when voltage is impressed between said first electrode layer and said second electrode layer while no voltage is applied to said gate electrode, and said connection region is made of first semiconductor type semiconductor.

21. The trench gate type semiconductor device according to claim 6, wherein an entirety of said second region is contained in said third semiconductor layer.

22. The trench gate type semiconductor device according to claim 6, wherein a depth of said bottom surface of said second region is the deepest in said second region.

23. The trench gate type semiconductor device according to claim 6, wherein said second region is provided apart from said second semiconductor layer.

24. The trench gate type semiconductor device according to claim 9, wherein a part of said third semiconductor layer is disposed between said bottom face of said groove and a top face of said second semiconductor layer.

25. The trench gate type semiconductor device according to claim 16, wherein an entirety of said bypass region is contained in said second semiconductor layer.

26. The trench gate type semiconductor device according to claim 16, said bypass region is made of first conductivity type semiconductor.

27. The trench gate type semiconductor device according to claim 16, wherein said bypass region is provided apart from said first semiconductor layer.

* * * * *